United States Patent
Dutton

(10) Patent No.: US 7,754,417 B2
(45) Date of Patent: Jul. 13, 2010

(54) PRINTED CIRCUITS AND METHOD FOR MAKING SAME

(76) Inventor: Steven Lee Dutton, 1801 E. South Fork Dr., Phoenix, AZ (US) 85048

( * ) Notice: Subject to any disclaimer, the term of this patent is extended or adjusted under 35 U.S.C. 154(b) by 77 days.

(21) Appl. No.: 11/751,350

(22) Filed: May 21, 2007

(65) Prior Publication Data

US 2008/0289858 A1    Nov. 27, 2008

(51) Int. Cl.
G03F 7/00 (2006.01)
G03F 7/40 (2006.01)

(52) U.S. Cl. .................. 430/331; 430/311; 430/325; 430/329; 430/330

(58) Field of Classification Search ............... 430/311, 430/330, 331, 329, 325
See application file for complete search history.

(56) References Cited

U.S. PATENT DOCUMENTS

| | | | |
|---|---|---|---|
| 4,666,735 A | 5/1987 | Hoover et al. | |
| 5,281,447 A | 1/1994 | Brady et al. | |
| 5,378,508 A * | 1/1995 | Castro et al. | 427/556 |
| 6,613,495 B2 * | 9/2003 | Shelnut | 430/280.1 |
| 7,524,528 B2 * | 4/2009 | Kodas et al. | 427/101 |
| 2004/0151978 A1 * | 8/2004 | Huang | 429/83 |
| 2004/0164293 A1 | 8/2004 | Maloney et al. | |
| 2006/0165877 A1 * | 7/2006 | Yanagimoto et al. | 427/58 |
| 2007/0104881 A1 * | 5/2007 | Kodas et al. | 427/375 |
| 2007/0163887 A1 * | 7/2007 | Hofmann | 205/80 |
| 2008/0006911 A1 * | 1/2008 | Nakahara et al. | 257/645 |
| 2008/0153320 A1 * | 6/2008 | Lin | 439/68 |
| 2008/0199665 A1 * | 8/2008 | Slater et al. | 428/209 |

* cited by examiner

*Primary Examiner*—Amanda C. Walke
(74) *Attorney, Agent, or Firm*—Zeman-Mullen Law Firm PLLC

(57) ABSTRACT

A method for making printed circuits and printed circuit boards which includes coating a non-metallized substrate and plating an image of a desired circuit design directly onto the coated substrate without the need to image the circuit design on an intermediate silver halide polyester film or diazo and utilizing existing imaging, developing and etching subtractive techniques in conventional printed circuit board processing.

15 Claims, 3 Drawing Sheets

PRINTED CIRCUITS AND METHOD FOR MAKING SAME

FIELD OF INVENTION

The present invention relates to a printed circuit board technology and more particularly to a method for making printed circuits which includes coating a non-metallized substrate and plating an image of a circuit design directly onto the coated substrate. The present invention also relates to printed circuits and printed circuit boards which result from this method.

BACKGROUND OF THE INVENTION

Prior art processes for making printed circuits and printed circuit boards typically use a silver halide polyester based film to create an image of a desired printed circuit along with several other steps and processes for forming and developing the printed circuit. A photo plotter is a piece of equipment that typically uses silver halide polyester film as the medium for imaging the design of a circuit. This equipment is then used in subsequent processing to image circuits for metallization or to print and etch specifically designed circuits. This is known as a print and etch process or a plate and etch process.

One example of a prior art process for forming printed circuit boards includes the steps of creating a CAD/CAM design, sending data relating to the design to a photo plotter, photo plotting to a silver halide polyester film, developing an image from the sent data, creating intermediate tools, scrubbing or cleaning substrate for imaging, coating the substrate with a dry film, imaging the substrate with the design, developing the image, etching the image, and then stripping the remaining dry film. This prior art process requires several steps and has limitations on the imaging, developing, and etching of fine line images. With this process, fine line imaging can be consistently performed down to 0.003 inches. Imaging of much finer lines, for example imaging fine lines down to 0.0025 inches, creates a problem and is inconsistent when using this prior art process. In addition, laminate must be purchased with copper adhered to a panel and this type of processing has inherent issues with undercutting and rough edges which can create "lossy" issues for high speed RF applications. In other words, with this process, any rough protrusions or undercutting act like small antennas and the signal travel speed is reduced or lost during high frequency applications. High frequency applications require smooth images and very thin copper.

Accordingly, there is a need for a new method for making printed circuits and printed circuit boards which facilitate fine line imaging without the inherent problem seen in the prior art processes. In addition, a method for making printed circuits and printed circuit boards is needed which will eliminate many of the steps used in prior art processes while still enabling the creation of printed circuits and printed circuit boards with fine line imaging with very flat non-rough surfaces without undercut utilizing very thin copper below 0.0002.

SUMMARY OF THE INVENTION

The present invention is directed to a method for making printed circuits and printed circuit boards which eliminates the need for silver film used in imaging dry film in prior art processes. The method for making printed circuits and printed circuit boards in the present invention includes the steps of coating a non-metallized substrate and plating an image of the circuit design directly onto the coated substrate. The image substrate can then be developed and processed to create a resulting printed circuit without the need for additional printing of dry film, developing of dry film and etching processes.

In one exemplary embodiment, the non-metallized substrate may be a liquid crystal polymer, a polyimide, a ceramic, a ceramic filled, a glass, a filled polytetrafluoroethylene, an unfilled polytetrafluoroethylene, a polytetrafluoroethylene woven glass, and a polytetrafluoroethylene non woven glass which is coated and an image of the desired circuit is then plated directly onto the coated substrate.

The present invention is also directed to a printed circuit that is made in accordance with the above-described method where the printed circuit includes fine line images down to 0.00025 inches with very thin copper.

Another exemplary method of the present invention for making printed circuits and printed circuit boards includes the steps of providing a non-metallized pre-tooled substrate, coating a surface of the substrate with a photosensitive chemical suitable for laser imaging, baking the coated substrate until dry, designing circuitry and sending data relating to the circuitry design to a laser photo plotter or direct imaging plotter, imaging the circuitry design directly onto the coated substrate material with the laser photo plotter or direct imaging plotter using the tooling in the coated substrate as a reference for the imaging step, developing the imaged substrate with one or more chemistries, and processing the developed image with a copper bath.

The previously described non-metallized substrates may be used with this method and the photosensitive chemicals used to coat the non-metallized surface may include a silver nitrate based liquid, a silver chloride based with citric acid and a photosensitive gelatin, an iron based material, a chrome copper based material, and a chrome nickel based material, an immersion gold material, a platinum based material used in conjunction with palladium.

BRIEF DESCRIPTION OF THE DRAWINGS

The present invention will hereinafter be described in conjunction with the appended drawing figures, wherein like numerals denote like elements, and.

DETAILED DESCRIPTION OF EXEMPLARY EMBODIMENTS

Methods of the present invention for fabricating printed circuits and printed circuit boards generally include providing a non-metallized substrate, coating the non-metallized substrate, and imaging of a circuit design directly onto the coated substrate. The image substrate may then be developed with one or more chemistries and processed by subjecting it to a copper bath in order to create a printed circuit or printed circuit board. It should be understood by those skilled in the art that any type of non-metallized substrate may be used as long as the substrate is uniform for imaging. In addition, those skilled in the art will understand that a number of photosensitive chemicals may be used to coat the surface of the non-metallized substrate and that a variety of chemistries may be used to develop the imaged substrate.

Figure 1:
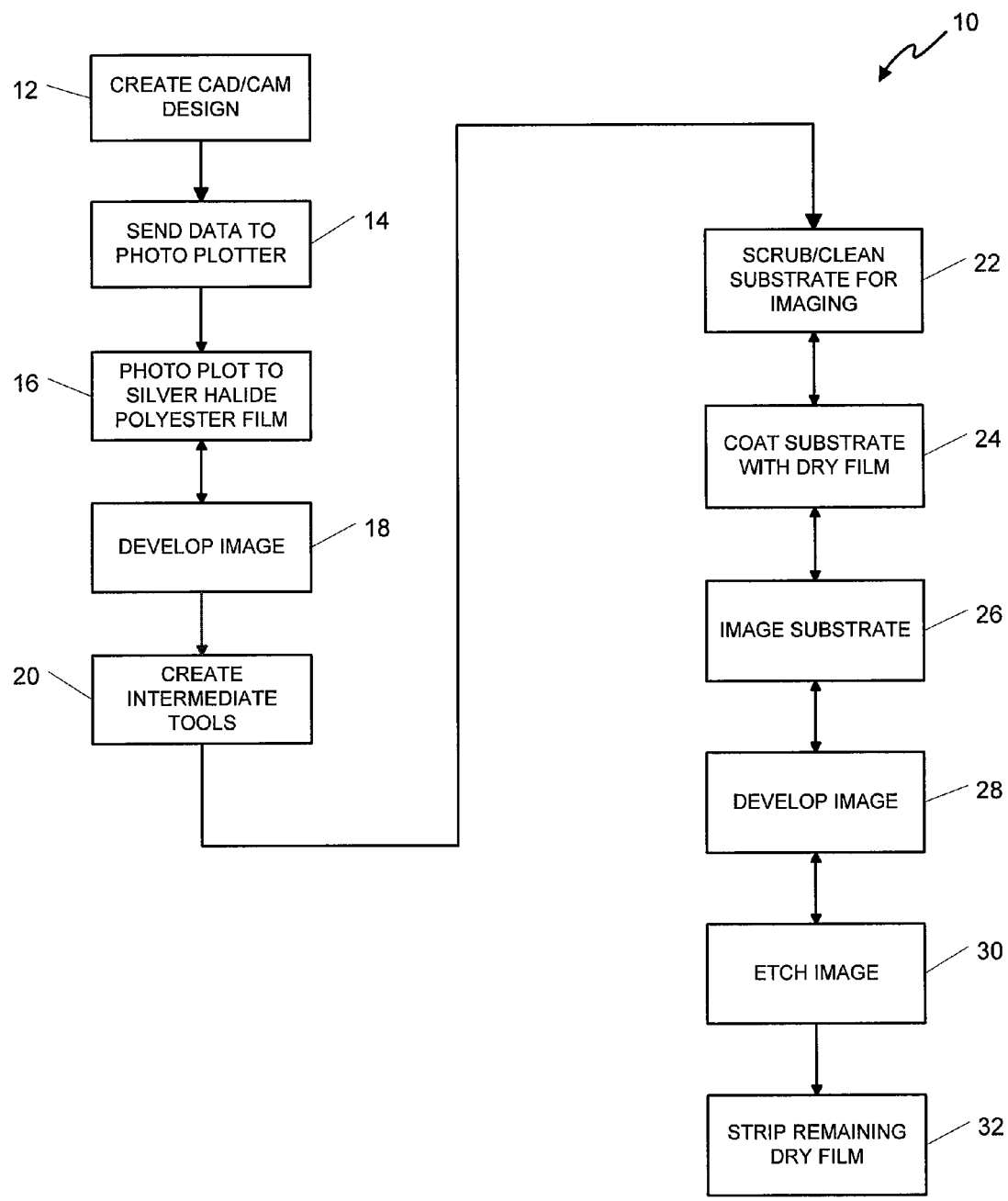
FIG. 1 is a flow chart depicting a prior art process for making printed circuits and printed circuit boards.

FIG. 1 shows a flow chart 10 which depicts a prior art process for forming printed circuits and printed circuit boards. In step 12, a circuit is created with a CAD/CAM design and the data relating to the circuit design is sent to a photo plotter in step 14. Next, in step 16, the circuit design is photo plotted to a silver halide polyester film and the image on the silver halide polyester film is then developed in step 18. Intermediate tools are created in step 20. A substrate, such as a liquid crystal polymer or a polytetrafluoroethylene is then scrubbed or cleaned in step 22 to ready it for imaging. The substrate is then coated with a dry film in step 24 and the substrate is imaged with the circuit design in step 26. Following imaging of the printed circuit on the coated substrate, the image of the printed circuit is developed in step 28. The developed image of the printed circuit on the coated substrate is then etched in step 30 and any remaining dry film is stripped away in step 32 in order to create a printed circuit.

Figure 2:
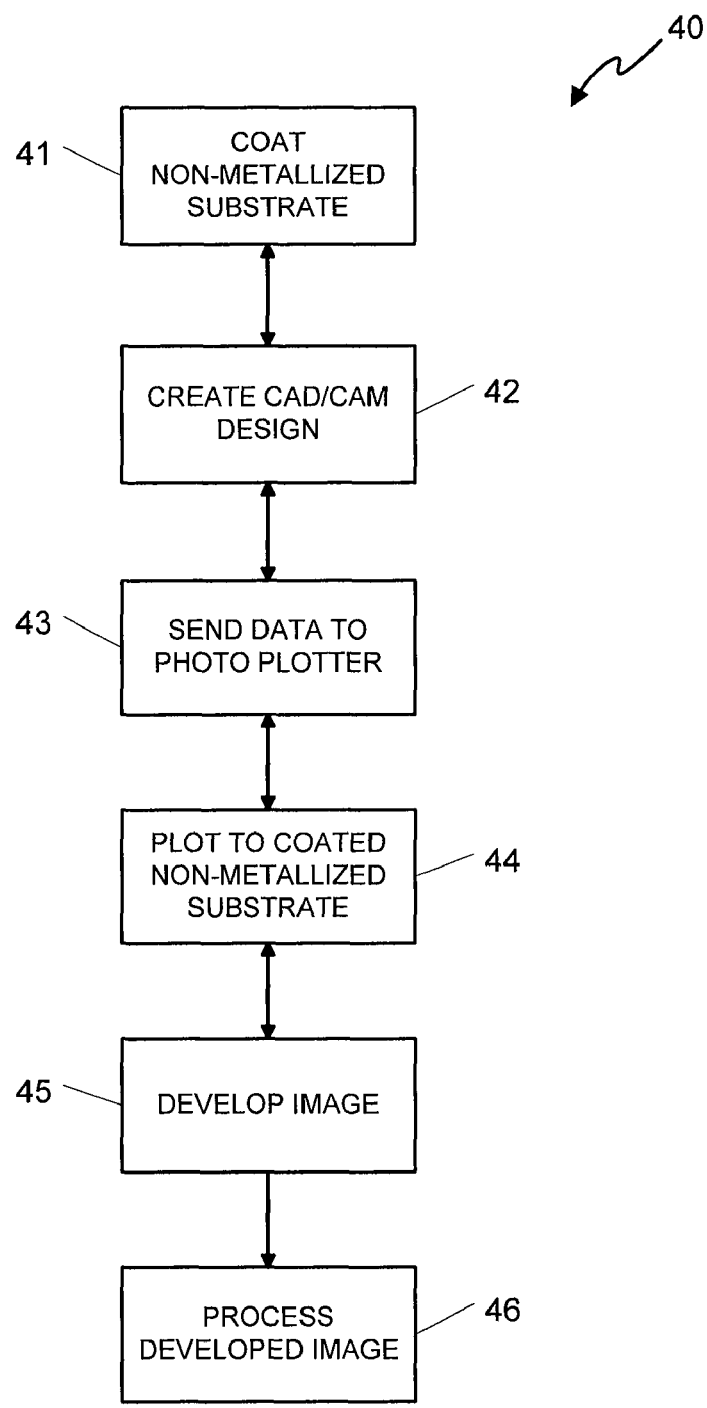
FIG. 2 is a flow chart depicting an exemplary embodiment of the method of the present invention for fabricating printed circuits and printed circuit boards.

Turning now to FIG. 2, flow chart 40 is shown which depicts an exemplary embodiment of the method of the present invention for fabricating a printed circuit or printed circuit board. First, a non-metallized substrate is coated in step 41. Then, in step 42, a circuit design is created. The data relating to the circuit design is then sent to a photo plotter or direct imaging equipment in step 43 and the image relating to the circuit design is directly plotted on the coated non-metallized substrate in step 44. Unlike prior art processes, the image is not plotted to an intermediate silver halide polyester film or diazo. The plotted or direct image of the circuit design is then developed in step 45 and the developed image is then processed in step 46 without the need for intermediate developing and etching processes.

Figure 3:
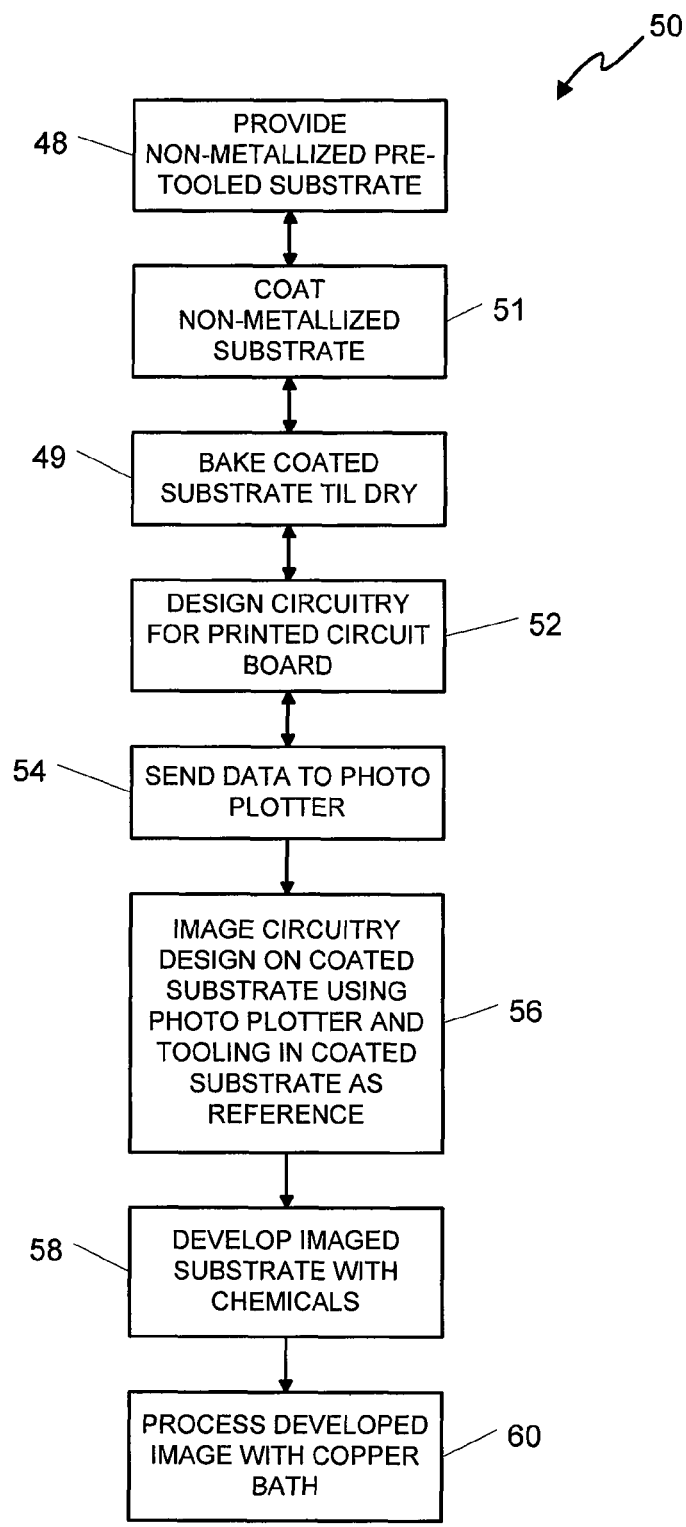
FIG. 3 is a flow chart depicting another exemplary embodiment of the method of the present invention for fabricating printed circuits and printed circuit boards.

Another, more detailed exemplary embodiment of the present invention for fabricating printed circuits and printed circuit boards is shown in FIG. 3 by flow chart 50. First, a non-metallized pre-tooled substrate is provided in step 48 which is then coated in step 51. The non-metallized pre-tooled substrate may comprise any substrate or bonding film known in the industry of printed circuit board technology as long as the substrate is flat and uniform for imaging. For example, the non-metallized substrate may be a liquid crystal polymer, a polyimide, a flat glass plate, a polyethylene terephthalate, a filled polytetrafluoroethylene, a unfilled polytetrafluoroethylene, a polytetrafluoroethylene woven glass, a polytetrafluoroethylene non woven glass, a low temperature cofired ceramic (LTCC), and a high temperature cofired ceramic (HTCC). The substrates may be woven or non woven and ceramic filled or unfilled. In addition, a number of known products may also be used as the non-metallized substrate including products known as KAPTON, SPEED BOARD C, ULTRALAM, FR4 EPOXIES, MULTIFUNCTIONAL EPOXIES, BT EPOXIES, LCP, and DUROID. The non-metallized pre-tooled substrate is coated in step 51 with a photosensitive chemical that is suitable for laser imaging. Such chemicals may include, but are not limited to, a silver nitrate based liquid, a silver chloride based with citric acid and photosensitive gelatin, an iron based material, a chrome copper based material, and a chrome nickel based material, electroless nickel, immersion gold, platinum based and palladium based material.

The coated substrate is then baked until dry in step 49. In one exemplary embodiment, the coated substrate is baked at 40 degrees Celsius in a conventional oven or a conveyor oven for approximately 20 to 30 minutes. The circuitry for the printed circuit or printed circuit board is then designed in step 52 and the data relating to the circuit design is sent to a photo plotter or laser direct imaging in step 54. Next, the circuitry design is imaged onto the coated substrate using the photo plotter or laser direct imager in step 56 and the tooling in the coated substrate is used as a reference guide during the imaging. In contrast to prior art processes, a silver halide polyester film is not used for imaging. Instead, the coated substrate is placed directly on the photo plotter or laser direct imager for imaging. As a result, the method of the present invention for fabricating printed circuits and printed circuit boards eliminates the need for a number of products, steps, and procedures including the need for silver film, diazo film, dry film, liquid dry films, collimated or non-collimated UV light sources, hot roll vacuum lamination, developing and etching and stripping of standard printed circuit boards, and waste treatment chemicals along with associated overhead and direct and indirect labor costs.

In the exemplary method shown in FIG. 3, the image substrate is then developed with chemistries in step 58. Here, chemistries such as any paper type developer like KODAK DEKTOL or NGS NAT 540 and FIXER NAT 750 may be used or EDTA based developer. Finally, the developed image is processed in step 60 with a copper bath to create the resulting printed circuit or printed circuit board. This may include any standard electroless copper plating process used for circuit board hole metallization that is known in the art.

It will be understood that the foregoing description is of preferred exemplary embodiments of the invention and that the invention is not limited to specific forms shown or described herein. Various modifications may be made in the design, arrangement, order, and types of steps disclosed herein for making and using the invention without departing from the scope of the invention as expressed in the appended claims.

The invention claimed is:

1. A method for making a printed circuit comprising coating a non-metallized substrate with a photosensitive chemical, developing the imaged substrate via exposure of the coated substrate to a predetermined image of a circuit design, processing the developed image by subjecting the imaged substrate to a copper bath, and plating the imaged circuit design directly onto the coated substrate without removing any portion of the substrate itself.

2. The method of claim 1 wherein the non-metallized substrate comprises at least one of a liquid crystal polymer, a polyimide, a polyethylene terephthalate, a filled polytetrafluoroethylene, an unfilled polytetrafluoroethylene, a polytetrafluoroethylene woven glass, a polytetrafluoroethylene non woven glass, a low temperature cofired ceramic, and a high temperature cofired ceramic.

3. The method of claim 1 wherein the non-metallized substrate comprises at least one of the products known as LCP, KAPTON, SPEED BOARD C, PET, ULTRALAM, and DUROID.

4. A printed circuit made in accordance with the method of claim 1.

5. The printed circuit board of claim 4 wherein the printed circuit comprises fine line images down to 0.00025 inches.

6. A method for making printed circuit boards comprising:
providing a non-metallized pre-tooled substrate;
coating a surface of the substrate with a photosensitive chemical suitable for laser imaging;
baking the coated substrate until dry;
designing circuitry and sending data relating to the circuitry design to a photo plotter;
imaging the circuitry design directly onto the coated substrate material with the photo plotter using the tooling in the coated substrate as a reference for the imaging step without removing any of the substrate;

developing the imaged substrate with one or more chemistries; and processing the developed image with a copper bath.

7. The method of claim 6 wherein the non-metallized pre-tooled substrate comprises at least one of a liquid crystal polymer, a polyimide, a polyethylene terephthalate, a filled polytetrafluoroethylene, an unfilled polytetrafluoroethylene, a polytetrafluoroethylene woven glass, a polytetrafluoroethylene non woven glass, a low temperature cofired ceramic, and a high temperature cofired ceramic.

8. The method of claim 7 wherein the non-metallized pre-tooled substrate comprises at least one of the products known as LCP, KAPTON, SPEED BOARD C, PET, ULTRALAM, and DUROID.

9. The method of claim 7 wherein the photosensitive chemical used to coat the non-metallized surface comprises one of a silver nitrate based liquid, a silver chloride based with citric acid and a photosensitive gelatin, an iron based material, a chrome copper based material, and a chrome nickel based material.

10. The method of claim 7 wherein the coated substrate is baked at 40 degrees C. in a conventional oven or a conveyor oven.

11. The method of claim 7 wherein the chemistries used to develop the imaged substrate comprise any chemistry used to develop an image on paper.

12. The method of claim 7 wherein processing the developed image in a copper bath results in metallizing the image left after photo plotting.

13. The method of claim 7 wherein the imaging step comprises imaging fine lines down to 0.00025 inches.

14. A printed circuit board made in accordance with the method of claim 7.

15. The printed circuit board of claim 14 wherein the printed circuit comprises fine line images down to 0.00025 inches.

* * * * *